United States Patent [19]
Huang et al.

[11] Patent Number: 6,159,661
[45] Date of Patent: *Dec. 12, 2000

[54] DUAL DAMASCENE PROCESS

[75] Inventors: Yimin Huang, Taichung Shien; Tri-Rung Yew, Hsin Chu Shien, both of Taiwan

[73] Assignee: United Microelectronics Corp., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/073,997

[22] Filed: May 7, 1998

[30] Foreign Application Priority Data

Apr. 3, 1998 [TW] Taiwan .................. 87105063

[51] Int. Cl.$^7$ ...................................................... G03F 7/00
[52] U.S. Cl. .............................................................. 430/313
[58] Field of Search .................................... 430/312, 313, 430/314, 316

[56] References Cited

U.S. PATENT DOCUMENTS

| | | | |
|---|---|---|---|
| 5,578,523 | 11/1996 | Fiordalice et al. | 437/190 |
| 5,635,423 | 6/1997 | Huang et al. | 437/195 |
| 5,679,608 | 10/1997 | Cheung et al. | 437/195 |
| 5,801,094 | 9/1998 | Yew et al. | 438/624 |
| 5,821,169 | 10/1998 | Nguyen et al. | 438/736 |
| 5,886,410 | 3/1999 | Chiang et al. | 257/759 |
| 5,916,823 | 6/1999 | Lou et al. | 438/738 |
| 5,933,761 | 8/1999 | Lee | 438/783 |

*Primary Examiner*—Kathleen Duda
*Attorney, Agent, or Firm*—Thomas, Kayden, Horstemeyer & Risley

[57] ABSTRACT

An improved dual damascene process for forming metal interconnects comprising the steps of providing a semiconductor substrate that has a conductive layer, a first dielectric layer and a first mask layer already formed thereon. The first dielectric layer is made from a low-k dielectric material. A first silicon oxynitride (SiON) layer is formed over the first mask layer. Next, the first silicon oxynitride layer is patterned, and then the first mask layer is etched using the first silicon oxynitride as a mask. Subsequently, a second dielectric layer and a second mask layer are formed over the first silicon oxynitride. The second dielectric layer can be made from a low-k dielectric material. Next, a second silicon oxynitride layer is formed over the second mask layer. Thereafter, the second silicon oxynitride layer is patterned, and then the second mask layer is etched using the second silicon oxynitride layer as a mask. Subsequently, using the second mask layer as a mask, the second dielectric layer is etched to form a metal wire opening. Etching continues down the metal wire opening to form a via opening in the first dielectric layer that exposes the conductive layer. Finally, metal is deposited into the metal wire opening and the via opening to form the dual damascene structure of this invention.

20 Claims, 8 Drawing Sheets

DUAL DAMASCENE PROCESS

CROSS-REFERENCE TO RELATED APPLICATION

This application claims the priority benefit of Taiwan application serial no. 87105063, filed Apr. 3, 1998 reference.

BACKGROUND OF THE INVENTION

1. Field of Invention

The present invention relates to a method of manufacturing metal interconnects. More particularly, the present invention relates to a dual damascene process suitable even for forming metal interconnects in low k dielectrics.

2. Description of Related Art

In the manufacturing of very large scale integrated (VLSI) semiconductors, multilevel interconnects, fabricated from two or more metal interconnect layers above a wafer, are quite common. The purpose of having multilevel interconnects is to increase three-dimensional wiring line structures so that the densely packed devices can be properly linked together. In general, the first layer of wiring lines can be made from polysilicon or a metal, and can be used to electrically couple the source/drain regions of devices in the substrate. In other words, through the formation of vias, devices in the substrate are electrically connected together. For connecting more devices, a second or more layers of metallic wiring can be used. With the increase in level of integration, a parasitic capacitance effect between metallic lines, which can lead to RC delay and cross talk between metallic lines, will increase correspondingly. Consequently, speed of conduction between metallic lines will be slower. Therefore, to reduce the parasitic capacitance effect, a type of low-k organic dielectric material is now commonly used for forming inter-layer dielectric or inter-metal dielectric (ILD/IMD) layers. The low-k organic dielectric material is quite effective in reducing RC delay between metallic lines. In practice, however, there are a number of technical problems regarding the use of low-k organic dielectric that still need to be addressed.

FIGS. 1A through 1E are cross-sectional views showing the progression of manufacturing steps for forming a via according to a conventional method. First, as shown in FIG. 1A, a semiconductor substrate 10 is provided. The substrate already has a metallic wire structure 12 formed thereon. Next, a dielectric layer 14 is deposited over the substrate 10 and the metal wire structure 12 using a chemical vapor deposition (CVD) method. The dielectric layer 14 can be made from a material that includes, for example, a low-k dielectric and preferably has a thickness of 7000–10000 Å.

Next, as shown in FIG. 1B, a silicon dioxide layer 16 used as a hard mask is deposited over the dielectric layer 14. The silicon dioxide layer 16 functions as a stop layer and a hard mask in subsequent etching operations.

Next, as shown in FIG. 1C, photolithographic and etching processes are used to pattern the silicon dioxide layer 16. Patterning of the silicon dioxide layer 16 involves the steps of forming a photoresist layer 18 over the silicon dioxide layer 16 and then defining and developing a required pattern on the photoresist layer 18. Finally, using the photoresist layer 18 as a mask, the silicon dioxide layer 16 is etched to form an opening in a position above the metal wire 12.

Next, as shown in FIG. 1D, etching is continued to form a via opening 19 in the dielectric layer 14, so that the via exposes the metal wire 12. This via opening 19 has rather steep sidewalls 15.

Finally, as shown in FIG. 1E, the photoresist layer 18 is removed using plasma that contains oxygen ($O_2$). The oxygen plasma ashing is isotropic. Since the dielectric layer 14 is made from a carbon-containing organic polymer, the dielectric layer 14 has properties very similar to the photoresist layer 18. Therefore, a portion of the exposed sidewalls 15 will be removed, forming recess cavities 15a on the sidewalls during the oxygen plasma ashing operation.

At present, a method of forming metal interconnects known as dual damascene process is rapidly being developed. FIGS. 2A through 2D are cross-sectional views showing the progression of manufacturing steps in producing a metal interconnect by a conventional dual damascene process.

First, as shown in FIG. 2A, a semiconductor substrate 20 is provided. The substrate 20 already has a metallic wire structure 21 formed thereon. Next, a dielectric layer 22 is deposited over the substrate 20, where the dielectric layer 22 can be made from a low-k dielectric material. Thereafter, a thin silicon dioxide layer 23 is deposited over the dielectric layer 22. The silicon dioxide layer 23 serves as an etching stop layer and a mask in subsequent etching operation. Then, the silicon dioxide layer 23 is etched to form a via opening 24 located above the metal wire structure 21.

Next, as shown in FIG. 2B, another dielectric layer 25 is deposited over the silicon dioxide layer 23. The dielectric layer 25 is preferably made from a low-k dielectric material that has etching properties different from those of the silicon dioxide layer 23. The dielectric layer 25 has a thickness roughly the same as the thickness of the second metallic wiring layer.

Next, as shown in FIG. 2C, photolithographic and etching processes are carried out to form a via 26 and a trench 27 in the dielectric layer 25. Since the silicon dioxide layer 23 can act as an etching stop layer, the etching of the trench 27 stop when the silicon dioxide layer 23 is reached. However, since there is an opening 24 in the silicon dioxide layer 23, etching will continue down the via 26 to expose the metal wire 21. Eventually, a via that links up with the metal wire 12 is formed.

In FIG. 2D, a preliminary metal layer (not shown) is deposited over the substrate 20 to at least fill the dual vias 26, 26a and the trench 27 of FIG. 2C. The preliminary metal layer is then polished by chemical-mechanical polishing (CMP) process to removed the top portion so that the preliminary metal layer becomes the metal layer 26b and the metal layer 27a filling the trench 27. The metal layer 26b is electrically coupled to the metal wire 21. Another metal wire layer (not shown) can be formed on the dielectric layer 25 and is electrically coupled to the metal wire 21 through the metal layer 26b.

However, the above dual damascene process still has a number of defects. For example, because the dielectric layer is formed from a low-k organic dielectric material, the dielectric layer has very low resistance against oxygen plasma etching during the process of removing the photoresist layer. Therefore, recess cavities will similarly be formed on the sidewalls of via 26 just like the recess cavities 15a formed on the sidewalls of via 19 in FIG. 1E.

In light of the foregoing, there is a need to improve dual damascene process for forming metal interconnects.

SUMMARY OF THE INVENTION

Accordingly, the present invention is to provide a dual damascene process suitable even for forming metal interconnects in a low-k dielectric layer so that the defects inherent in a conventional dual damascene process are improved and the production of metal interconnects is facilitated.

To achieve these and other advantages and in accordance with the purpose of the invention, as embodied and broadly described herein, the invention provides a dual damascene process. The process comprises the steps of first providing a semiconductor substrate that has a conductive layer already formed thereon, and then forming a first dielectric layer and a first mask layer sequentially over the conductive layer. The first dielectric layer can be made from a low-k dielectric material including, for example, an organic polymer. Next, a first silicon oxynitride (SiON) layer is formed over the first mask layer. Thereafter, photolithographic and etching operations are carried out to pattern the first silicon oxynitride layer, and then etch the first mask layer using the first silicon oxynitride as a mask thereby exposing a portion of the first dielectric layer. Subsequently, a second dielectric layer is formed over the first silicon oxynitride so that the first dielectric layer and the second dielectric layer are connected. The second dielectric layer can be made from a low-k dielectric material including, for example, an organic polymer. Next, a second mask layer and a second silicon oxynitride layer are sequentially formed over the second dielectric layer. Thereafter, another set of photolithographic and etching operations is conducted to pattern the second silicon oxynitride layer, and then the second mask layer is etched using the second silicon oxynitride layer as a mask. Next, using the second mask layer as a mask, the second dielectric layer is etched to form a metal wire opening that exposes the first dielectric layer. Thereafter, etching is continued down the metal wire opening forming a via opening in the first dielectric layer that exposes the conductive layer. Finally, metal is deposited into the metal wire opening and the via opening to form the dual damascene structure of this invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
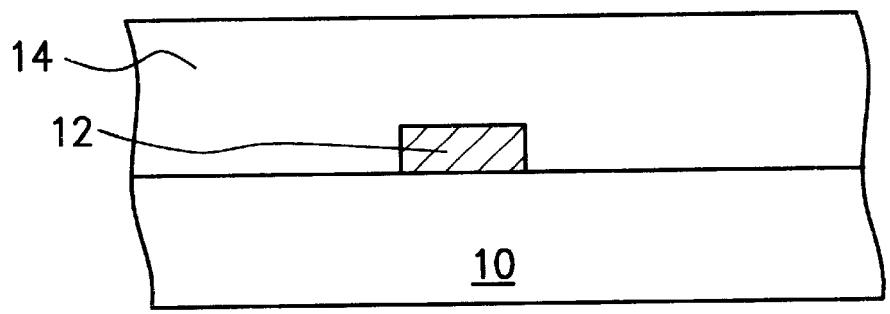
FIGS. 1A through 1E are cross-sectional views showing the progression of manufacturing steps for forming a via according to a conventional method.
Figure 1B:
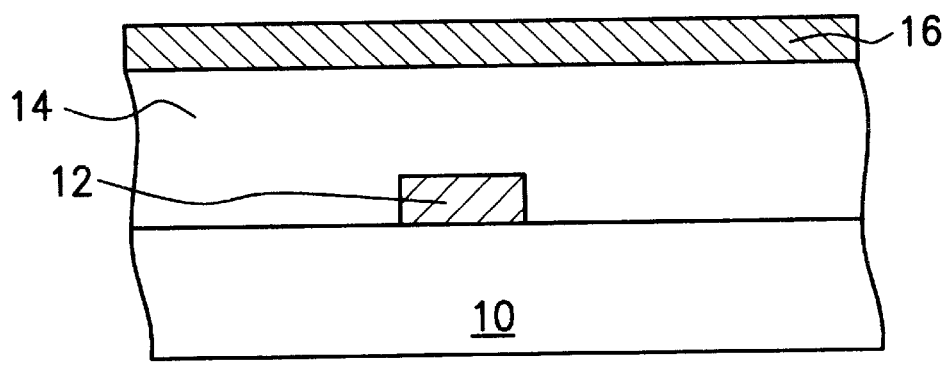
Figure 1C:
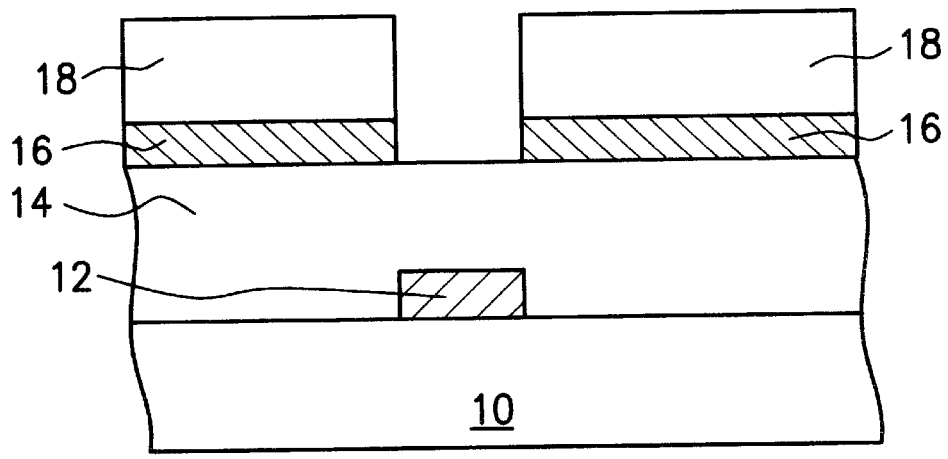
Figure 1D:
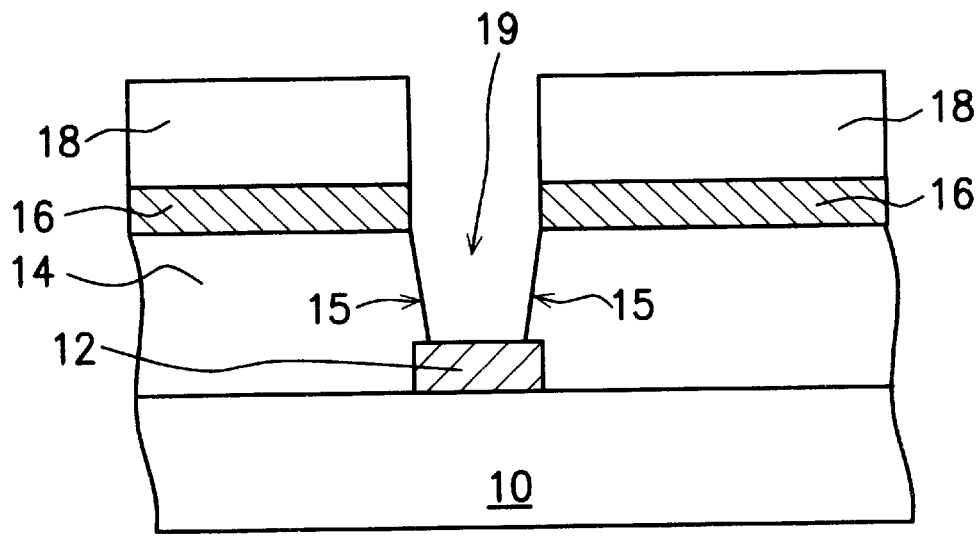
Figure 1E:
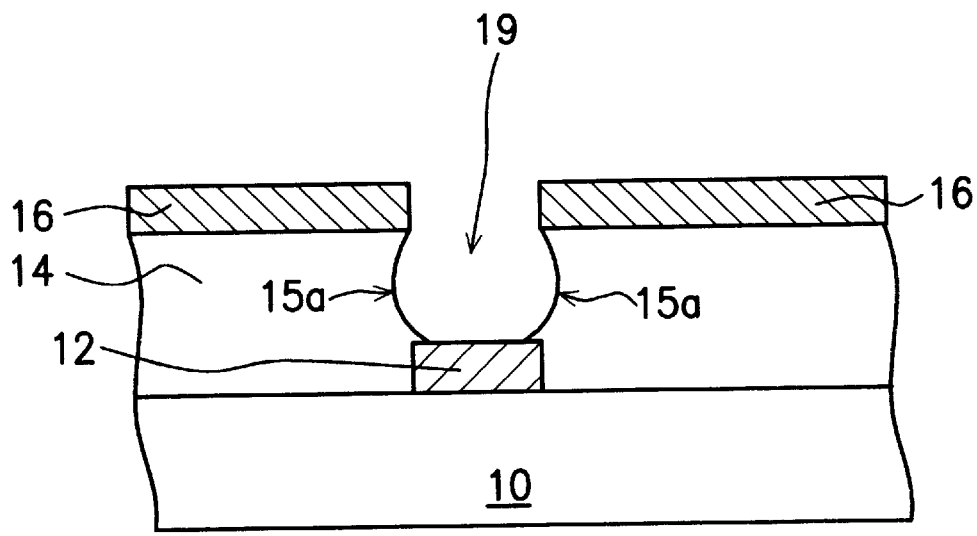
Figure 2A:
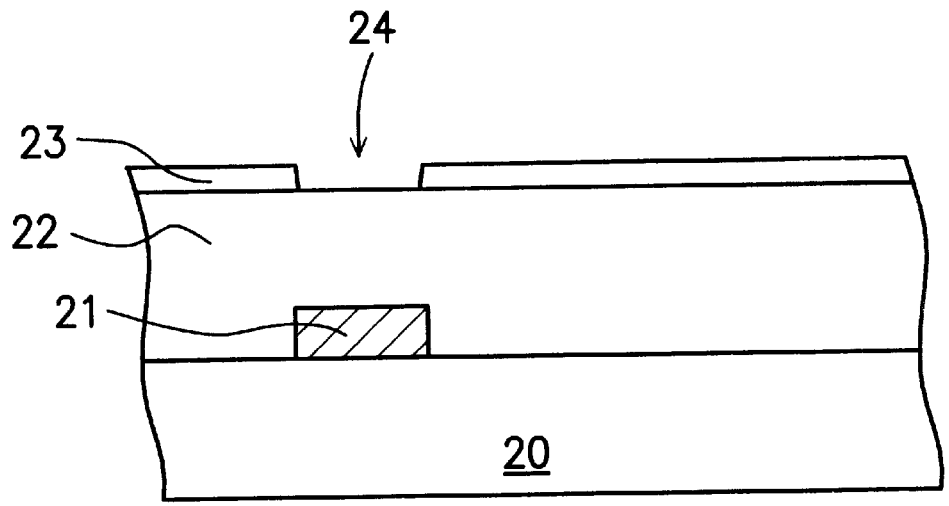
FIGS. 2A through 2D are cross-sectional views showing the progression of manufacturing steps in producing a metal interconnect by a conventional dual damascene process.
Figure 2B:
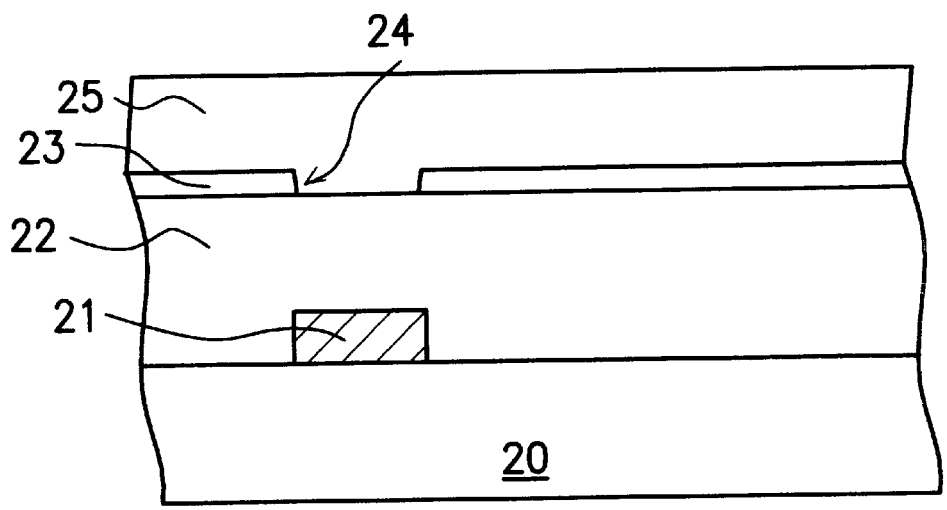
Figure 2C:
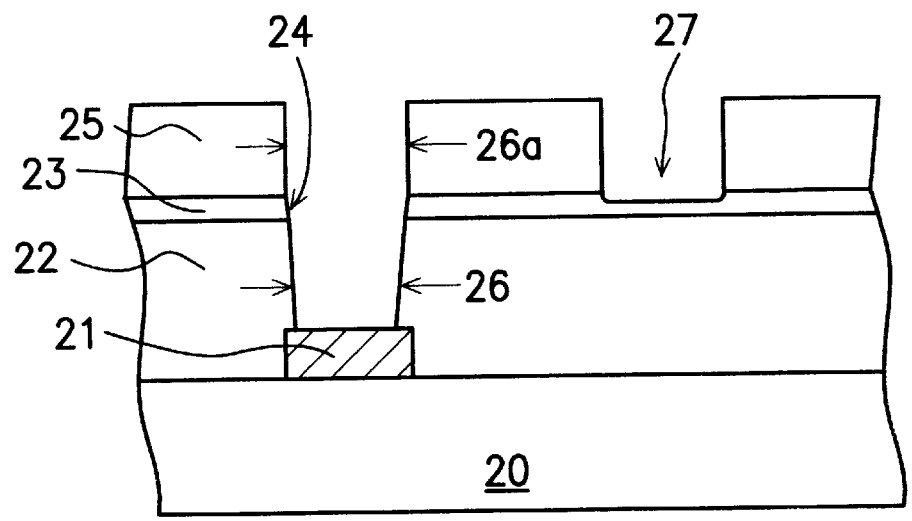
Figure 2D:
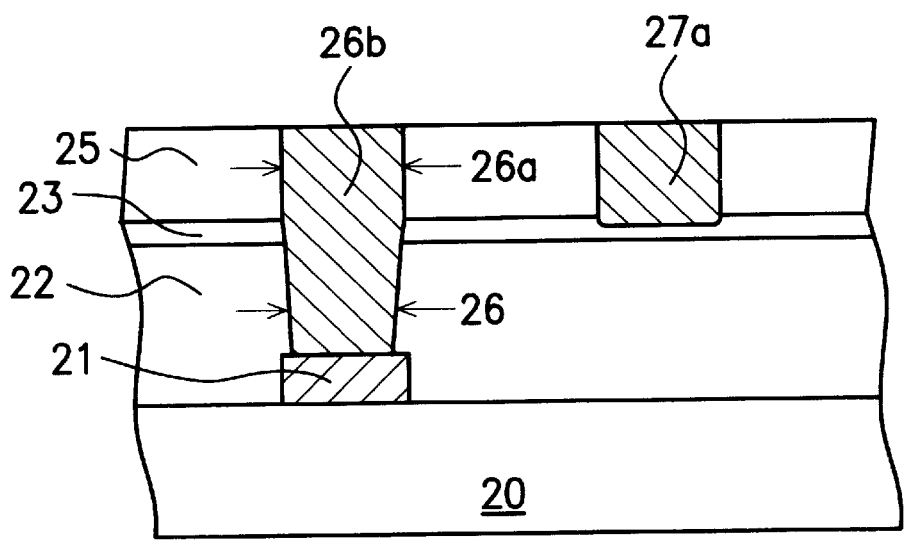

Reference will now be made in detail to the present preferred embodiments of the invention, examples of which are illustrated in the accompanying drawings. Wherever possible, the same reference numbers are used in the drawings and the description to refer to the same or like parts.

This invention improves the conventional damascene process by forming additional cap layers, preferably silicon oxynitride (SiON) layers, over the oxide hard mask layers. The cap layers are able to protect the low-k dielectrics underneath them through three etching operations where photoresist layers are removed by oxygen plasma.

Figure 3A:
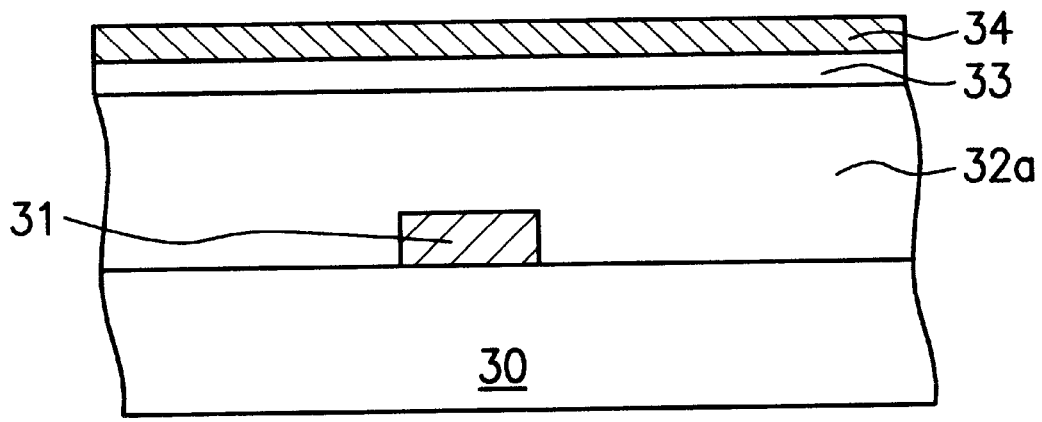
FIGS. 3A through 3H are cross-sectional views showing the progression of manufacturing steps in producing a metal interconnect by a dual damascene process according to one preferred embodiment of this invention.

FIGS. 3A through 3H are cross-sectional views showing the progression of manufacturing steps in producing a metal interconnect by a dual damascene process according to one preferred embodiment of this invention. First, as shown in FIG. 3A, a semiconductor substrate 30 is provided. A first metallic wiring layer 31 or a transistor structure is already formed over the substrate 30. Next, a first dielectric layer 32a is formed over the substrate 30 and the wiring layer 31. The first dielectric layer 32a is preferably a low-k dielectric layer, for example, an organic polymer. Thickness of the first dielectric layer 32a can be suitably adjusted to reflect the particular surface structure of the substrate 30. For example, the thickness of the dielectric layer 32a can range from about 1000–2000 Å. Thereafter, a hard mask 33 is formed over the first dielectric layer 32a. The hard mask 33, preferably having a thickness of about 300–500 Å, can be a silicon dioxide ($SiO_2$) layer. Subsequently, a cap layer 34 is formed over the hard mask layer 33. The cap layer 34 is an innovation is this invention, and is preferably a silicon oxynitride (SiON) layer. This cap layer 34 not only can protect the first dielectric layer 32a against etching by oxygen plasma, it can also act as an anti-reflective coating (ARC) in subsequent deep ultra violet (DUV) photolithographic operations. The cap layer 34 has a thickness of about 300–600 Å.

Figure 3B:
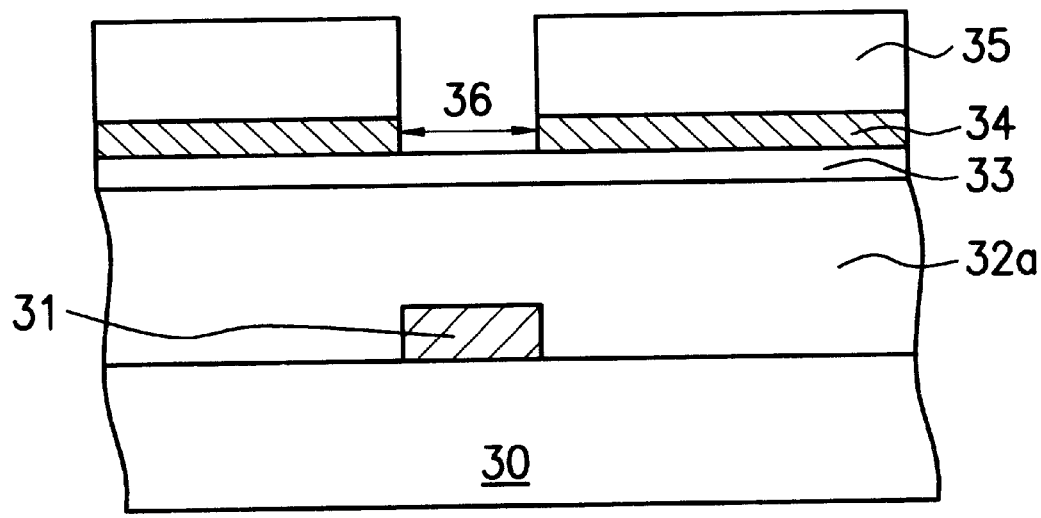

Next, as shown in FIG. 3B, photolithographic and etching operations are used to pattern the cap layer 34 and the mask layer 33. First, a photoresist layer 35 is formed over the cap layer 34, and then the photoresist layer 35 is patterned to have a desired pattern. Subsequently, using the photoresist layer 35 as a mask, the cap layer 34 is etched to form an opening 36 directly above the first wiring layer 31. Thereafter, the photoresist layer 35 is removed using oxygen plasma.

Figure 3C:
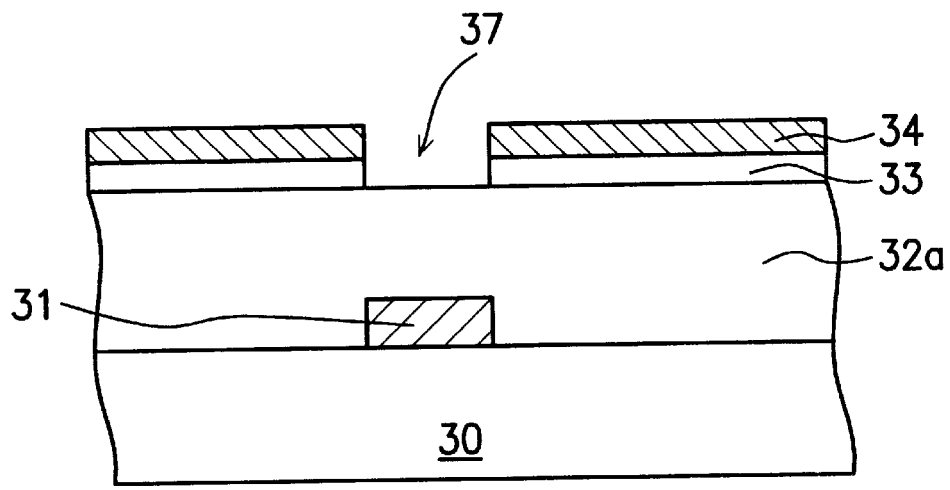

Next, as shown in FIG. 3C, the mask layer 33 is etched using the cap layer as a mask to form another opening 37. Since the photoresist layer 35 has already been removed, there is no need to use oxygen plasma for removing photoresist material. Therefore, the subsequently exposed first dielectric layer 32a will not be subjected to attack by oxygen plasma.

Figure 3D:
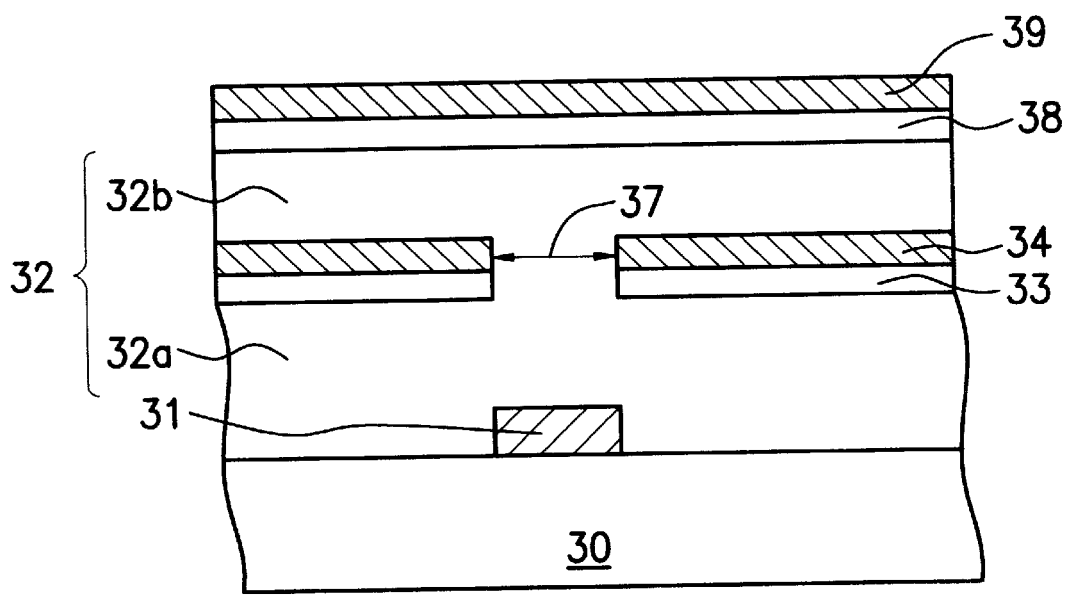

Next, as shown in FIG. 3D, dielectric material, preferably a low-k dielectric such as an organic polymer, is deposited over the cap layer 34 and into the opening 37 to form a second dielectric layer 32b. The second dielectric layer 32b and the first dielectric layer 32a together constitute a dielectric layer 32. Subsequently, another mask layer 38 and another cap oxide layer 39 are sequentially formed over the dielectric layer 32. The mask layer 38 having a thickness of about 1000–2000 Å is preferably a silicon dioxide ($SiO_2$) layer. The cap layer 39 is an innovation of this invention, and is preferably a silicon oxynitride (SiON) layer. This cap layer 39 not only protects the dielectric layer 32 against etching by oxygen plasma, but also acts as an anti-reflective coating (ARC) in subsequent deep ultra violet (DUV) photolithographic operations.

Figure 3E:
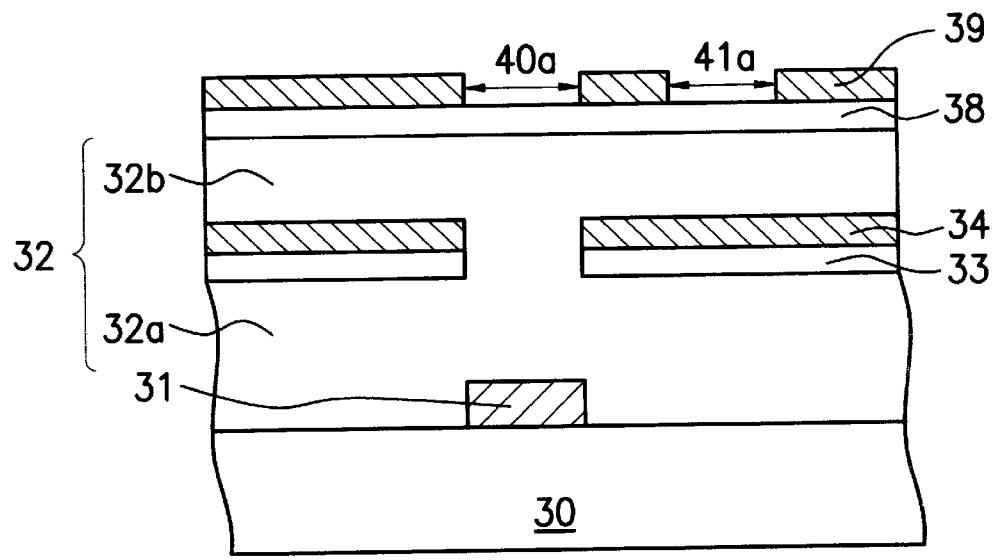

Next, as shown in FIG. 3E, photolithographic and etching operations are carried out to form openings 40a and 41a in the cap layer 39 in preparation for a second metallic wiring layer. The method of forming the openings 40a and 41a includes forming a photoresist layer over the cap layer, and then patterning the photoresist layer. Thereafter, using the photoresist layer as a mask, the cap layer 39 is etched to form the openings 40a and 41a. Finally, the photoresist layer is removed using oxygen plasma.

Figure 3F:
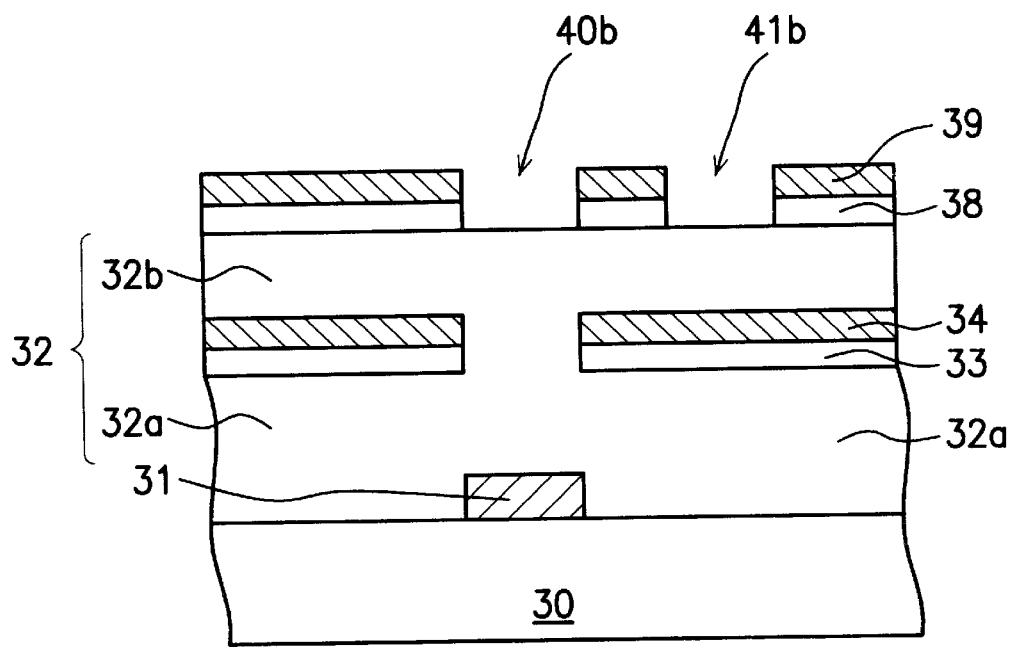

Next, as shown in FIG. 3F, the mask layer 38 is etched using the cap layer 39 as a mask to form openings 40b and 41b. Since the photoresist layer has already been removed, there is no need to use oxygen plasma for removing photoresist material. Therefore, the subsequently exposed dielectric layer 32 will not be subjected to attack by oxygen plasma.

Figure 3G:
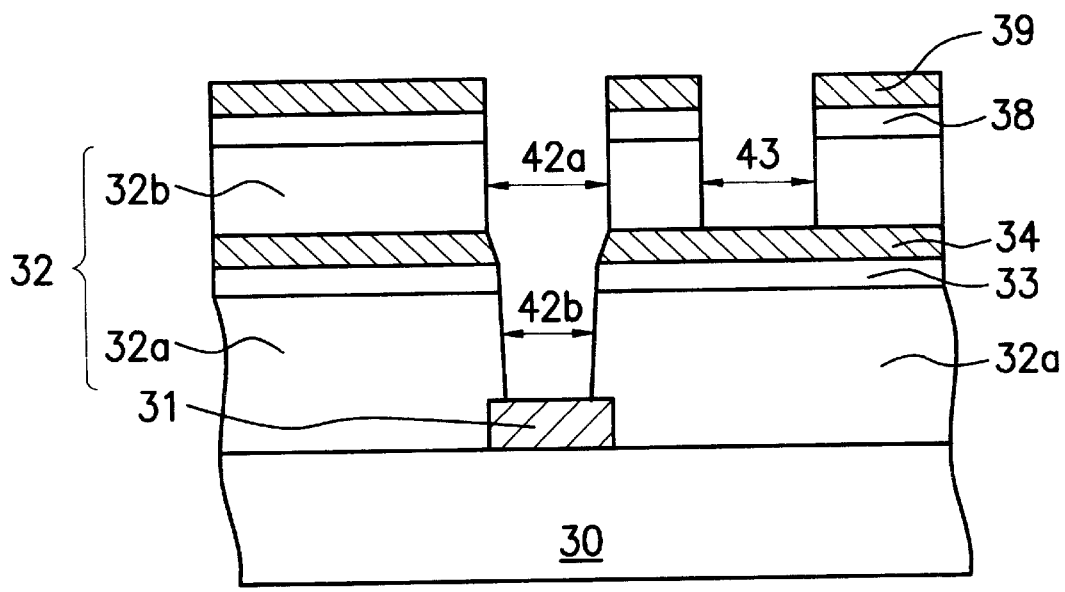

Next, as shown in FIG. 3G, photolithographic and etching operations are again carried out using the mask layer 38 as a mask. In the etching operation, a portion of the dielectric layer 32 is etched away to form openings 42a and 43 for laying the metal wiring. Then, etching of the dielectric layer 32 continues down the opening 42a, and finally forms a via 42b that exposes the first wiring layer 31. The etchants for carrying out the etching operation can include, for example, a mixture of $C_4F_8$ and CO or $CF_4$ together with other gases such as $O_2$, $CHF_3$, Ar or $N_2$.

Figure 3H:
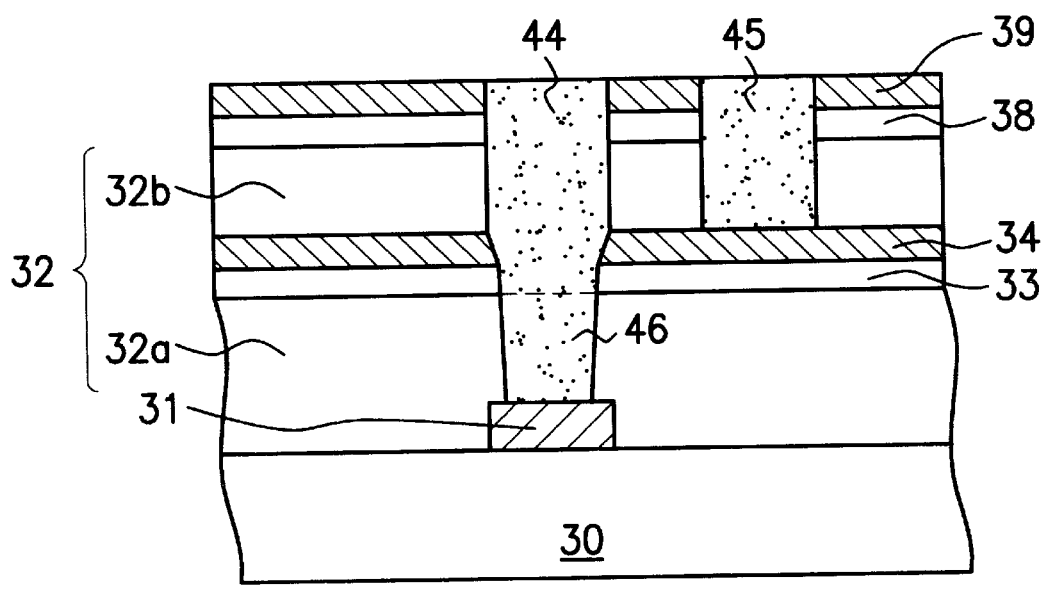

As shown in FIG. 3H, conductive material is deposited into the openings 42a, 43 and the via 42b to form a second metal wiring 44, a second metal wiring 45 and a via plug 46. The conductive material can be a metal, for example, aluminum and copper, that can be deposited by sputtering or a chemical vapor deposition. Thereafter, the conductive layer is suitably polished using, for example, a chemical-mechanical polishing (CMP) method. Finally, conductive material above the cap layer 39 is removed, thereby completing the fabrication of metal interconnect structure.

Obviously, this invention is not restricted to the formation of a two-layered metal interconnect structure. This invention is also applicable to the formation of metal interconnects that link up multiple layers. The method is to form a first dielectric layer, an etching stop layer, a second dielectric layer and a hard mask layer sequentially over the second metal wiring layer. Then, a two-stage etching operation is similarly conducted to form a third metallic wiring pattern.

In addition, the relative position between the mask layer and the cap layer can be reversed. For example, the mask layer can be formed above the cap layer with the rest of the sequence of operations remaining unchanged. In other words, by reversing the mask layer and the cap layer, the low-k dielectric layer can still be protected in the same fashion against any attack by oxygen plasma, and the cap layer can still act as an anti-reflection layer in subsequent deep ultra violet (DUV) photolithographic operations.

In summary, the improved dual damascene process of this invention has advantages, those advantages including:

(1) The dual damascene process of this invention is suitable even for forming metal interconnects in a low-k dielectric layer (for example, an organic polymer layer). The method is able to prevent the attack of oxygen plasma on via opening 42b or metal wiring openings 42a and 43, and hence is capable of increasing the gap-filling capacity of subsequently deposited metallic layer.

(2) The cap layers 34 and 39, made preferably from silicon oxynitride (SiON), are able to prevent oxygen plasma from making contact with the low-k dielectric layer 32 when the photoresist layer is removed.

(3) The cap layers 34 and 39, made preferably from silicon oxynitride (SiON), can function as an anti-reflective layer (ARC) in subsequent photolithographic operation.

(4) Position of the cap layers 34 and 39 in this invention can be reversed with respect to the mask layers 33 and 38 respectively. The reversal will not affect the capacity of the cap layers 34 and 39 to protect the low-k dielectric layer 32 against attack by oxygen plasma.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene process comprising steps of:

providing a semiconductor substrate that has a conductive layer already formed thereon;

forming a first dielectric layer over the conductive layer and the substrate;

forming a first mask layer on the first dielectric layer;

forming a first cap layer on the first mask layer;

patterning the first cap layer by photolithography and etching so as to form a first opening therein above the first conductive layer;

removing a photoresist layer using an oxygen plasma;

etching the first mask layer using the first cap layer as a mask to expose a portion of the first dielectric layer;

forming a second dielectric layer over the first dielectric layer so that the first dielectric layer and the second dielectric layer are connected together through at least the exposes portion of the first dielectric layer;

forming a second mask layer on the second dielectric layer;

forming a second cap layer on the second mask layer;

patterning the second cap layer by photolithography and etching to form a second opening exposing a portion of the second mask layer;

etching the second mask layer using the second cap layer as a mask, and then etching the second dielectric layer additionally using the second mask layer as a mask to form a metal wiring opening that exposes a portion of the first dielectric layer and the first opening of the first cap layer;

removing a photoresist layer using an oxygen plasma;

etching the first dielectric layer and forming a via opening in the first dielectric layer that exposes the conductive layer, wherein the first cap layer and the first mask layer cooperate to serve as an etching mask for etching the first dielectric layer; and forming an interconnecting layer over the second dielectric layer and also filling the metal wiring opening and the via opening, so that the conductive layer is electrically coupled to the interconnecting layer.

2. The process of claim 1, wherein the conductive layer further includes a metal wiring structure.

3. The process of claim 1, wherein the step of forming the first dielectric layer includes depositing a low-k dielectric material.

4. The process of claim 1, wherein the step of forming the first dielectric layer includes depositing an organic polymer.

5. The process of claim 1, wherein the step of forming the first mask layer includes depositing a silicon dioxide layer.

6. The process of claim 1, wherein the step of forming the first cap layer includes depositing silicon oxynitride (SiON).

7. The process of claim 1, wherein the step of forming the first mask layer includes depositing silicon oxynitride (SiON), and the step of forming the first cap layer includes depositing silicon dioxide.

8. The process of claim 1, wherein the step of forming the second dielectric layer includes depositing a low-k dielectric material.

9. The process of claim 1, wherein the step of forming the second dielectric layer includes depositing an organic polymer.

10. The process of claim 1, wherein the step of forming the second mask layer includes depositing a silicon dioxide layer.

11. The process of claim 1, wherein the step of forming the second cap layer includes depositing silicon oxynitride (SiON).

12. The process of claim 1, wherein the step of forming the second mask layer includes depositing silicon oxynitride (SiON), and the step of forming the second cap layer includes depositing silicon dioxide.

13. A dual damascene process suitable for forming metal interconnects in a low-k dielectric layer, comprising steps of:

providing a semiconductor substrate that has a conductive layer already formed thereon;

forming a first dielectric layer over the conductive layer and the substrate;

forming a first mask layer over the first dielectric layer;

forming a first silicon oxynitride (SiON) layer over the first mask layer;

patterning the first silicon oxynitride layer by photolithography and etching to form a first opening exposing a portion of the first mask layer;

removing a photoresist layer using an oxygen plasma;

etching the first mask layer using the first silicon oxynitride layer as a mask to expose a portion of the first dielectric layer;

forming a second dielectric layer over the first dielectric layer so that the first dielectric layer and the second dielectric layer are connected together through at least the exposed portion of the first dielectric layer;

forming a second mask layer over the second dielectric layer;

forming a second silicon oxynitride layer over the second mask layer;

patterning the second silicon oxynitride layer by photolithography and etching to form a second opening that exposes a portion of the second mask layer;

removing a photoresist layer using an oxygen plasma;

etching the second mask layer using the second silicon oxynitride layer as a mask, and then etching the second dielectric layer additionally using the second mask layer as a mask to form a metal wiring opening that exposes a portion of the first dielectric layer;

etching the first dielectric layer and forming a via opening in the first dielectric layer that exposes a portion of the conductive layer, wherein the first silicon oxynitride layer and the first mask layer also cooperate to serve as an etching mask for etching the first dielectric layer; and forming an interconnecting layer over the second dielectric layer and also filling the metal wiring opening and the via opening, so that the conductive layer is electrically coupled to the interconnecting layer.

14. The process of claim 13 wherein the conductive layer further includes a metal wiring structure.

15. The process of claim 13, wherein the step of forming the first dielectric layer includes depositing a low-k dielectric material.

16. The process of claim 13, wherein the step of forming the first dielectric layer includes depositing an organic polymer.

17. The process of claim 13, wherein the step of forming the first mask layer includes depositing a silicon dioxide layer.

18. The process of claim 13, wherein the step of forming the second dielectric layer includes depositing a low-k dielectric material.

19. The process of claim 13, wherein the step of forming the second dielectric layer includes depositing an organic polymer.

20. The process of claim 13, wherein the step of forming the second mask layer includes depositing a silicon dioxide layer.

* * * * *